United States Patent
Matsumoto et al.

(10) Patent No.: US 7,782,064 B2
(45) Date of Patent: Aug. 24, 2010

(54) TEST APPARATUS AND TEST MODULE

(75) Inventors: Junichi Matsumoto, Saitama (JP); Masuhiro Yamada, Tochigi (JP)

(73) Assignee: Advantest Corporation, Tokyo (JP)

( * ) Notice: Subject to any disclaimer, the term of this patent is extended or adjusted under 35 U.S.C. 154(b) by 122 days.

(21) Appl. No.: 12/276,416

(22) Filed: Nov. 24, 2008

(65) Prior Publication Data

US 2009/0295404 A1   Dec. 3, 2009

Related U.S. Application Data

(63) Continuation of application No. PCT/JP2007/059062, filed on Apr. 26, 2007.

(30) Foreign Application Priority Data

May 26, 2006   (JP)   ............................. 2006-147191

(51) Int. Cl.
*H01H 31/02*   (2006.01)
(52) U.S. Cl. .................... 324/555; 324/763; 324/765
(58) Field of Classification Search .................. 324/555
See application file for complete search history.

(56) References Cited

U.S. PATENT DOCUMENTS

| | | | |
|---|---|---|---|
| 6,532,561 B1 * | 3/2003 | Turnquist et al. | 714/738 |
| 6,728,903 B1 * | 4/2004 | Kato | 714/31 |
| 7,203,611 B2 * | 4/2007 | Doi | 702/69 |
| 7,231,573 B2 * | 6/2007 | Davis et al. | 714/744 |

FOREIGN PATENT DOCUMENTS

| | | |
|---|---|---|
| JP | 63-10471 | 1/1988 |
| JP | 2000-105261 | 4/2000 |
| JP | 2004-212291 | 7/2004 |
| JP | 2006-54731 | 2/2006 |

* cited by examiner

*Primary Examiner*—Thomas Valone
(74) *Attorney, Agent, or Firm*—Jianq Chyun IP Office

(57) ABSTRACT

Provided is a test apparatus that tests a device under test, comprising a control apparatus that controls the test apparatus; a pattern generator that generates a plurality of test patterns to be provided to a plurality of input terminals of the device under test; a plurality of variable delay circuits that designate a timing for supplying each of the plurality of test patterns to a corresponding input terminal of the plurality of input terminals; and a plurality of micro-controllers that operate in parallel, according to instructions from the control apparatus, to each measure a delay amount of a variable delay circuit when the variable delay circuit is set with a prescribed delay setting value and store the delay setting value in association with the measured delay amount.

12 Claims, 8 Drawing Sheets

| DELAY DESIGNATION VALUE M-bit (e.g. 8-bit) | DELAY SETTING VALUE N-bit (e.g. 12-bit) |
|---|---|
| 0×00 (0ps) | ××× |
| 0×01 (14.7ps) | ××× |
| ⋮ | ⋮ |
| 0×1A (380.9ps) | 0×6BA |
| 0×1B (395.5ps) | 0×6CB |
| ⋮ | ⋮ |
| 0×FF (3735.8ps) | ××× |

FIG. 4

TEST APPARATUS AND TEST MODULE

CROSS REFERENCE TO RELATED APPLICATION

This is a continuation application of PCT/JP2007/59062 filed on Apr. 26, 2007 which claims priority from a Japanese Patent Application NO. 2006-147191 filed on May 26, 2006, the contents of which are incorporated herein by reference.

BACKGROUND

1. Technical Field

The present invention relates to a test apparatus and a test module. In particular, the present invention relates to a test apparatus and a test module provided with a plurality of variable delay circuits.

2. Related Art

A test apparatus such as a memory tester delays a reference clock using variable delay circuits to generate timing signals indicating certain edge timings, and then generates test signals that are supplied to a device under test according to the timing signals. The variable delay circuits change the delay amount of the reference clock according to the times designated by the test patterns.

Here, the variable delay circuits aim to accurately control the delay amount, and therefore can change the delay amount by time increments that are sufficiently shorter than the resolution of the time designated by the test patterns, as shown in, for example, Japanese Patent Application Publication No. 2006-54731. Accordingly, before testing, the test apparatus must perform a process, such as a linearity correction process, that measures the actual delay time of the delay setting for each of the variable delay circuits and stores each time designated by the test pattern in the memory, e.g. a linearized memory, along with the setting value of the corresponding variable delay circuit.

The test apparatus sequentially selects one variable delay circuit at a time to undergo the linearity correction process using one main control apparatus, such as a system controller. Furthermore, test apparatuses are being provided with more variable delay circuits to enable parallel testing of a greater number of pins. Therefore, it is difficult for conventional test apparatuses to perform the linearity correction process before testing in a short amount of time.

SUMMARY

Therefore, it is an object of an aspect of the innovations herein to provide a test apparatus and a test module, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a control apparatus that controls the test apparatus; a pattern generator that generates a plurality of test patterns to be provided to a plurality of input terminals of the device under test; a plurality of variable delay circuits that designate a timing for supplying each of the plurality of test patterns to a corresponding input terminal of the plurality of input terminals; and a plurality of micro-controllers that operate in parallel, according to instructions from the control apparatus, to each measure a delay amount of a variable delay circuit when the variable delay circuit is set with a prescribed delay setting value and store the delay setting value in association with the measured delay amount.

According to a second aspect related to the innovations herein, one exemplary test module may include a test module that is implemented in a test apparatus testing a device under test, comprising a pattern generator that generates a plurality of test patterns to be provided to a plurality of input terminals of the device under test; a plurality of variable delay circuits that designate a timing for supplying each of the plurality of test patterns to a corresponding input terminal of the plurality of input terminals; and a plurality of micro-controllers that operate in parallel, according to instructions from the control apparatus, to each measure a delay amount of a variable delay circuit when the variable delay circuit is set with a prescribed delay setting value and store the delay setting value in association with the measured delay amount.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 4 is an exemplary table showing a correspondence between delay setting values and delay designation values stored in the memory 32 according to the present embodiment.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
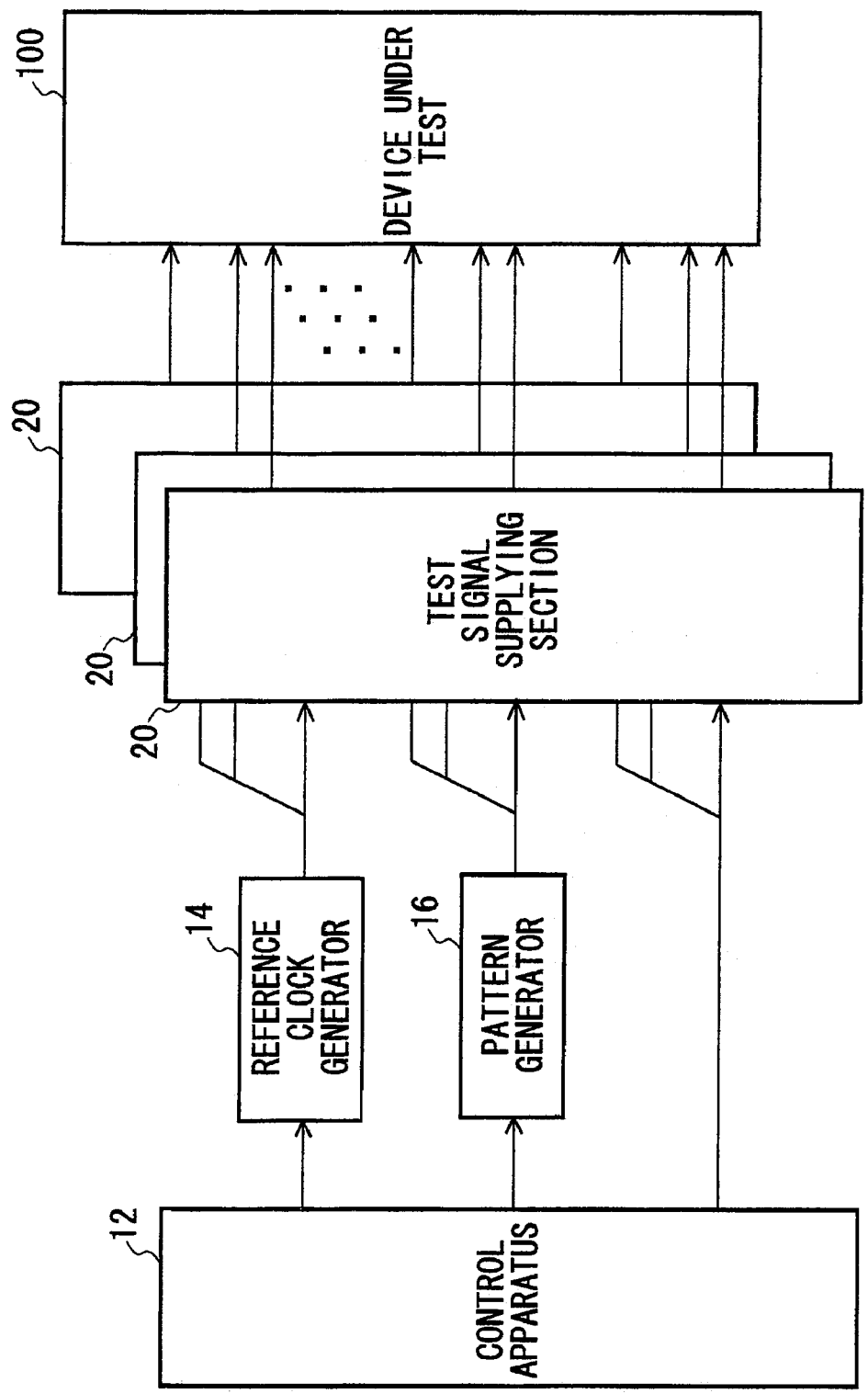
FIG. 1 shows a configuration of a test apparatus 10 according to an embodiment of the present invention, along with a device under test 100.

FIG. 1 shows a configuration of a test apparatus 10 according to an embodiment of the present invention, along with a device under test 100. The test apparatus 10 tests the device under test 100, and is provided with a control apparatus 12, a reference clock generator 14, a pattern generator 16, and a plurality of test signal supplying sections 20.

The control apparatus 12 controls the test apparatus 10. For example, the control apparatus 12 controls the reference clock generator 14, the pattern generator 16, and the plurality of test signal supplying sections 20 via a bus. The reference clock generator 14 generates a reference clock and supplies the reference clock to each of the plurality of test signal supplying sections 20. The pattern generator 16 generates a plurality of test patterns that designate the patterns of test signals to be supplied to a plurality of input terminals of the device under test 100. Here, "input terminals" refers to input-only terminals and to input/output terminals.

The plurality of test signal supplying sections 20 are each provided to correspond to one of a plurality of groups of input terminals, each group including two or more input terminals, of one or more devices under test 100. Each test signal supplying section 20 supplies each input terminal in the corresponding group with the test signal based on the test pattern. The test apparatus 10 may be provided with a test module having the reference clock generator 14, the pattern generator 16, and the plurality of test signal supplying sections 20, and with a separate control apparatus 12 that controls this test module.

Figure 2:
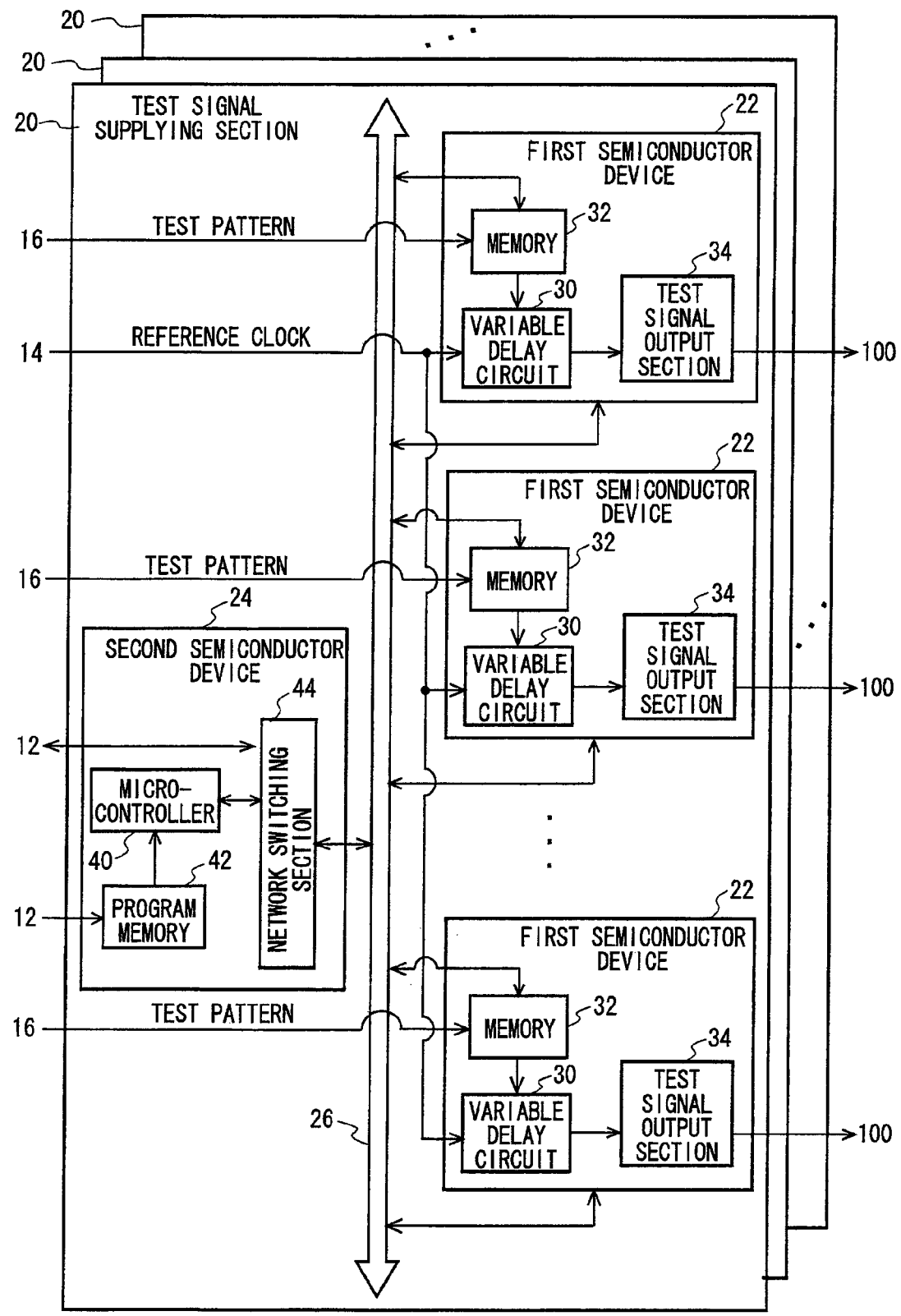
FIG. 2 shows a configuration of a test signal supplying section 20 according to the present embodiment.

FIG. 2 shows a configuration of a test signal supplying section 20 according to the present embodiment. Each test signal supplying section 20 includes a plurality of variable delay circuits 30, a plurality of memories 32, e.g. linearized memories, and a plurality of test signal output sections 34, which are all provided to correspond respectively to the input terminals in the group corresponding to the test signal supplying section 20. Each test signal supplying section 20 also includes a micro-controller 40, a program memory 42, and a network switching section 44.

In the present embodiment, each test signal supplying section 20 may include a plurality of first semiconductor devices 22, a second semiconductor device 24, and a local network 26. Each first semiconductor device 22 includes a variable delay circuit 30, a memory 32, and a test signal output section 34, which correspond to at least one input terminal in the group corresponding to the test signal supplying section 20 in which the variable delay circuit 30, the memory 32, and the test signal output section 34 are provided. The second semiconductor device 24 includes a micro-controller 40, a program memory 42, and a network switching section 44, which are connected to the control apparatus 12. The second semiconductor device 24 sends a request to access a register in the first semiconductor device 22 from the control apparatus 12 to the local network 26, receives an access response from the first semiconductor device 22 via the local network 26, and sends the access response to the control apparatus 12. The local network 26 connects the second semiconductor device 24 to the plurality of first semiconductor devices 22.

Each variable delay circuit 30 receives the reference clock output by the reference clock generator 14 and the delay setting value output by the corresponding memory 32. Each variable delay circuit 30 outputs a timing signal obtained by delaying the reference clock by the delay amount designated by the received delay setting value.

Each memory 32 stores delay setting values for setting the delay of the corresponding variable delay circuit 30 in association with delay designation values. Each memory 32 is a data conversion table for converting a logical delay amount into a physical delay amount. Each memory 32 associates the logical delay amount, which is the received delay designation value, with a physical delay amount of the variable delay circuit 30, and stores the delay setting value used for the data conversion. Each memory 32 receives from the reference clock generator 14 a test pattern that designates the timing at which the test signal changes according to the delay time, i.e. the delay designation value, from the reference timing. Each memory 32 outputs, to the corresponding variable delay circuit 30, the delay setting value stored in association with the delay designation value designated by the test pattern corresponding to the input terminal.

Each test signal output section 34 receives, from the corresponding variable delay circuit 30, the timing signal that indicates the timing at which the test signal output to the corresponding input terminal changes. Each test signal output section 34 outputs, to the corresponding input terminal, the test signal generated based on the corresponding timing signal. For example, each test signal output section 34 generates a test signal that rises or falls in synchronization with the corresponding timing signal, and outputs the generated test signal to the corresponding input terminal.

In order to store the delay setting values in the memories 32, each micro-controller 40 performs a calibration process in advance to measure the delay amount corresponding to the delay setting value of each variable delay circuit 30 in the corresponding group, according to instructions from the control apparatus 12. The micro-controller 40 then stores the delay setting value corresponding to each delay designation value based on the measurement result in the memory 32 for the corresponding variable delay circuit 30. The above process performed by the micro-controller 40 is referred to as a "linear correction process" hereinafter.

Each program memory 42 stores a microprogram executed by the micro-controller 40. Prior to testing, each micro-controller 40 operates according to the microprogram stored in the corresponding program memory 42 to perform the linearity correction process. Prior to the performance of the linearity correction process, the control apparatus 12 may write the microprogram to the program memory 42 in each test signal supplying section 20 using a broadcast, for example.

Each network switching section 44 switches whether the micro-controller 40 in the second semiconductor device 24 is connected to the local network 26 so that the micro-controller 40 controls the first semiconductor devices 22, or whether the control apparatus 12 is connected to the local network 26 via the second semiconductor device 24. For example, each network switching section 44 has a register that holds setting values indicating whether the control apparatus 12 or the micro-controller 40 is connected to the local network 26, and switches the connection according to what the control apparatus 12 writes thereto. For example, when adjusting the delay setting values of the variable delay circuits 30 associated with each group, the control apparatus 12 may set the network switching section 44 to connect the micro-controller 40 in this test signal supplying section 20 to the local network 26. In this way, the control apparatus 12 can cause each micro-controller 40 to perform the linearity correction process for the corresponding group of variable delay circuits 30, without directly accessing the variable delay circuits 30. When accessing the register inside the first semiconductor device 22, for example, the control apparatus 12 may set the network switching section 44 to connect the control apparatus 12 to the local network 26. In this way, the control apparatus 12 can directly access the first semiconductor devices 22 to test the device under test 100.

The test apparatus 10 described above can perform the linearity correction process in parallel for each variable delay circuit 30 in a plurality of groups that each include two ore more input terminals from among a plurality of input terminals. In this way, the test apparatus 10 can quickly perform the linearity correction process on a plurality of variable delay circuits 30. Furthermore, in addition to performing the linearity correction process on a plurality of variable delay circuits 30, the micro-controller 40 in each test signal supplying section 20 may evaluate the operation of the first semiconductor devices 22 before testing. In this way, the test apparatus 10 can evaluate the operation of the first semiconductor devices 22 in parallel before testing.

Figure 3:
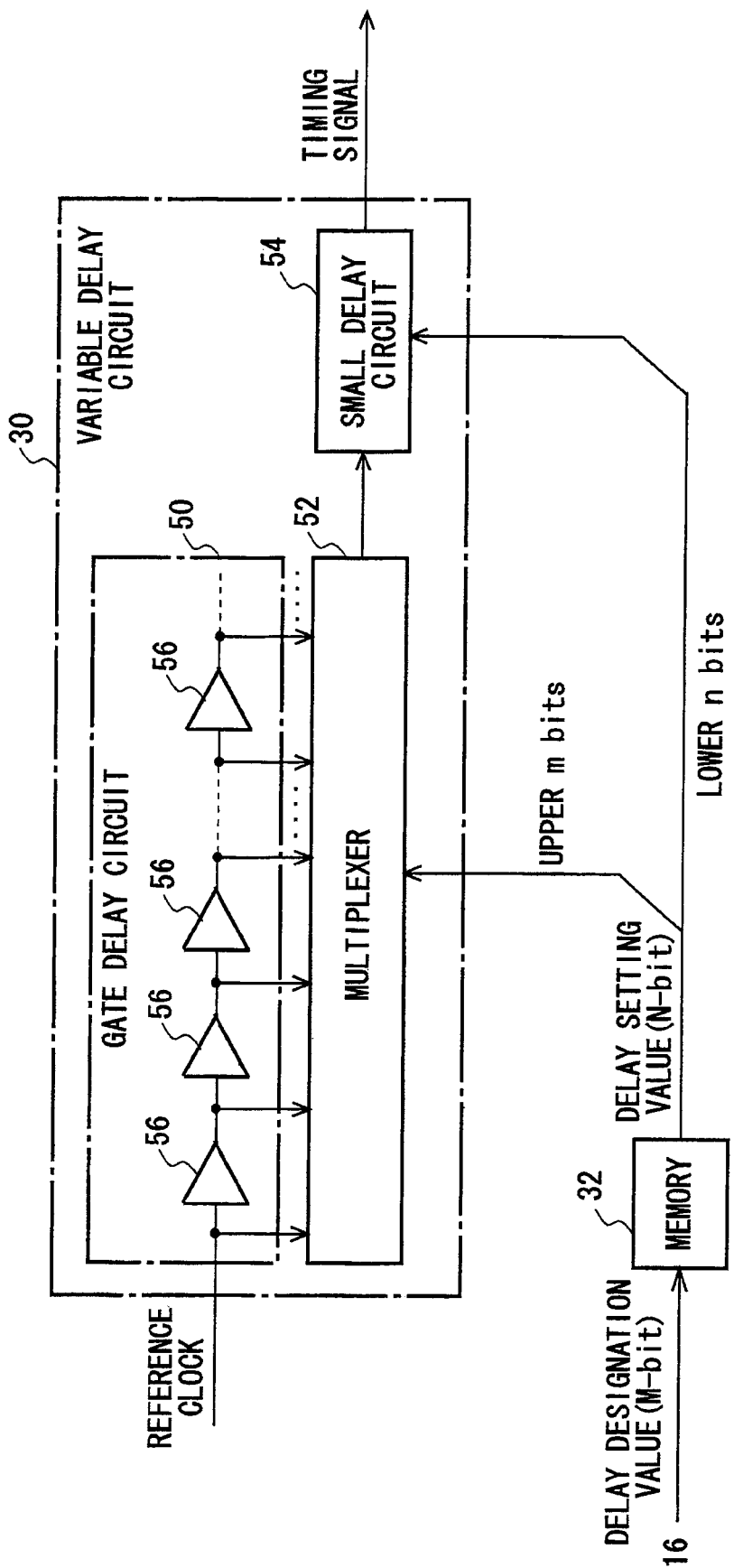
FIG. 3 shows an exemplary configuration of the variable delay circuit 30 along with the memory 32 according to the present embodiment.

FIG. 3 shows an exemplary configuration of the variable delay circuit 30 along with the memory 32 according to the present embodiment. FIG. 4 is an exemplary table showing a correspondence between delay setting values and delay designation values stored in the memory 32 according to the present embodiment.

In the present embodiment, the memory 32 stores N-bit delay setting values corresponding respectively to M-bit delay designation values. Here, M is a positive integer and N is a positive integer greater than M. The memory 32 may store a table, such as that shown in FIG. 4, that stores a 12-bit delay setting value corresponding to each 8-bit delay designation value. The memory 32 outputs the N-bit delay setting value corresponding to the M-bit delay designation value designated by the test pattern.

In the present embodiment, the variable delay circuit 30 includes a gate delay circuit 50, a multiplexer 52, and a small delay circuit 54. The gate delay circuit 50 includes a plurality of gate delay elements 56 arranged in series and having substantially the same delay time. The gate delay circuit 50 passes the received reference clock sequentially through the gate delay elements 56 each having a gate-unit delay, and supplies the multiplexer 52 with the resulting output signal from each gate delay element 56. The multiplexer 52 selects the delayed reference clock that is output by one of the plurality of gate delay elements 56, according to the delay setting value, and outputs the selected signal to the small delay circuit 54. For example, the multiplexer 52 may select the reference clock output by one of the gate delay elements 56 according to the upper m bits of the N-bit delay setting values.

The small delay circuit 54 can have a small delay that is less than the gate-unit delay. The small delay circuit 54 receives the reference clock output by the multiplexer 52, delays this reference clock by an amount according to the delay setting value, and outputs the resulting signal as the timing signal. For example, the small delay circuit 54 delays the reference clock output by the multiplexer 52 by an amount corresponding to the lower n bits in the N-bit delay setting value, where the bottom n bits are the bits remaining after the upper m nits are removed. The small delay circuit 54 outputs the resulting signal as the timing signal. The small delay circuit 54 may change the delay time by units equal to approximately $1/(2^n)$ of the delay time of each gate delay element 56. The variable delay circuit 30 and memory 32 described above can control the delay amount with a resolution (N-bit) that is higher than the resolution (M-bit) of the delay designation values designated by the test pattern.

Figure 5:
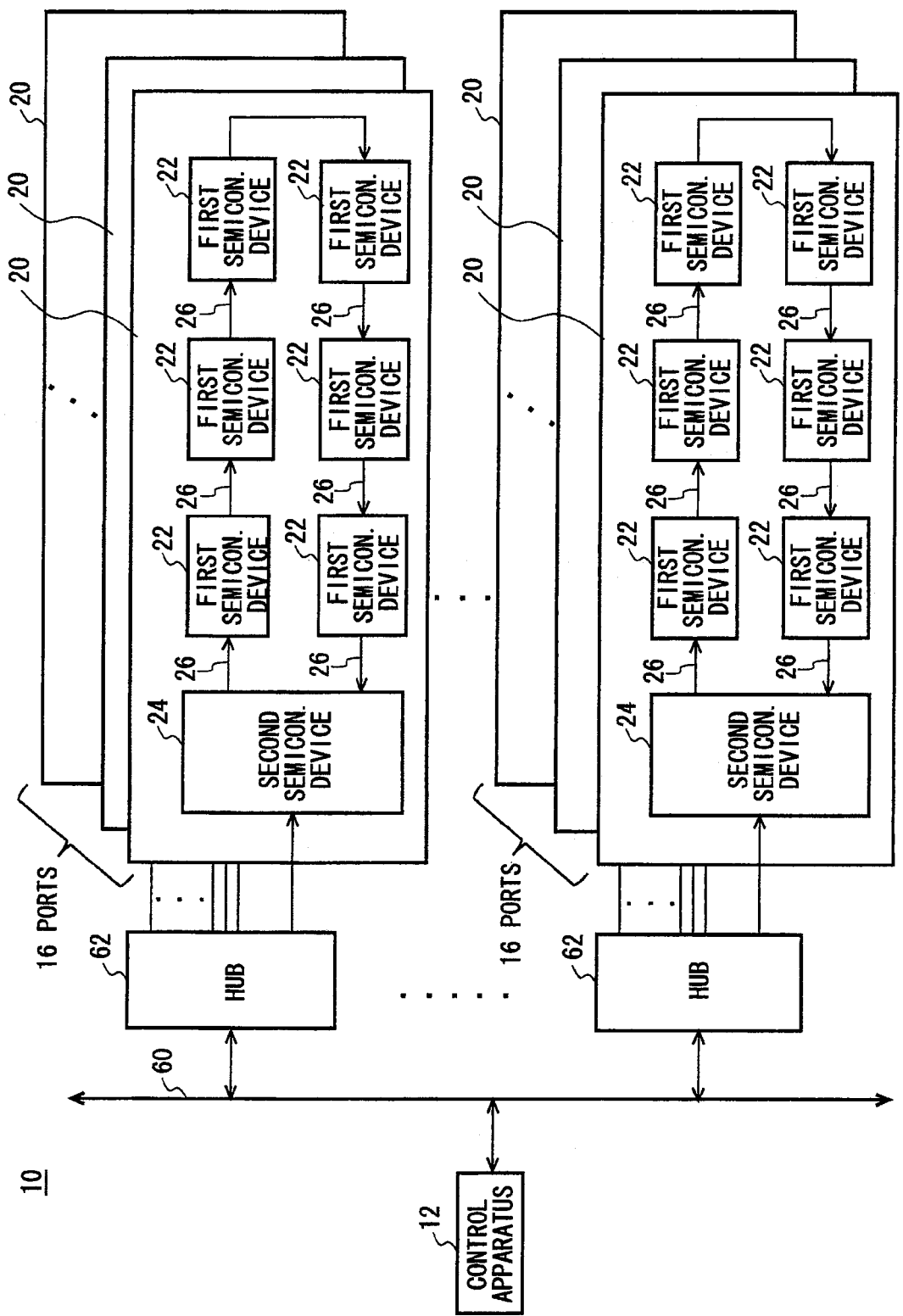
FIG. 5 shows an exemplary configuration for connecting the control apparatus 12 in the test apparatus 10 to the test signal supplying sections 20.

FIG. 5 shows an exemplary configuration for connecting the control apparatus 12 in the test apparatus 10 to the test signal supplying sections 20. The test apparatus 10 may be further provided with a tester bus 60 and a plurality of hubs 62 that connect to the tester bus 60. In this case, the control apparatus 12 is connected to the tester bus 60. The second semiconductor device 24 in each test signal supplying section 20 is connected to one corresponding hub 62. The test apparatus 10 may be connected to 8 hubs 62 that can each connect to 16 test signal supplying sections 20, thereby connecting the test apparatus 10 to 128 test signal supplying sections 20.

In the present embodiment, the plurality of first semiconductor devices 22 in each test signal supplying section 20 may be connected to the corresponding second semiconductor device 24 via a ring-shaped local network 26. In this way, the first semiconductor devices 22 and the second semiconductor devices 24 can be connected to each other by a small number of terminals.

The test apparatus 10 connected in the above manner enables the control apparatus 12 to access a plurality of test signal supplying sections 20 in parallel and to perform the linearity correction process independently for each second semiconductor device 24 in the plurality of test signal supplying sections 20.

Figure 6:
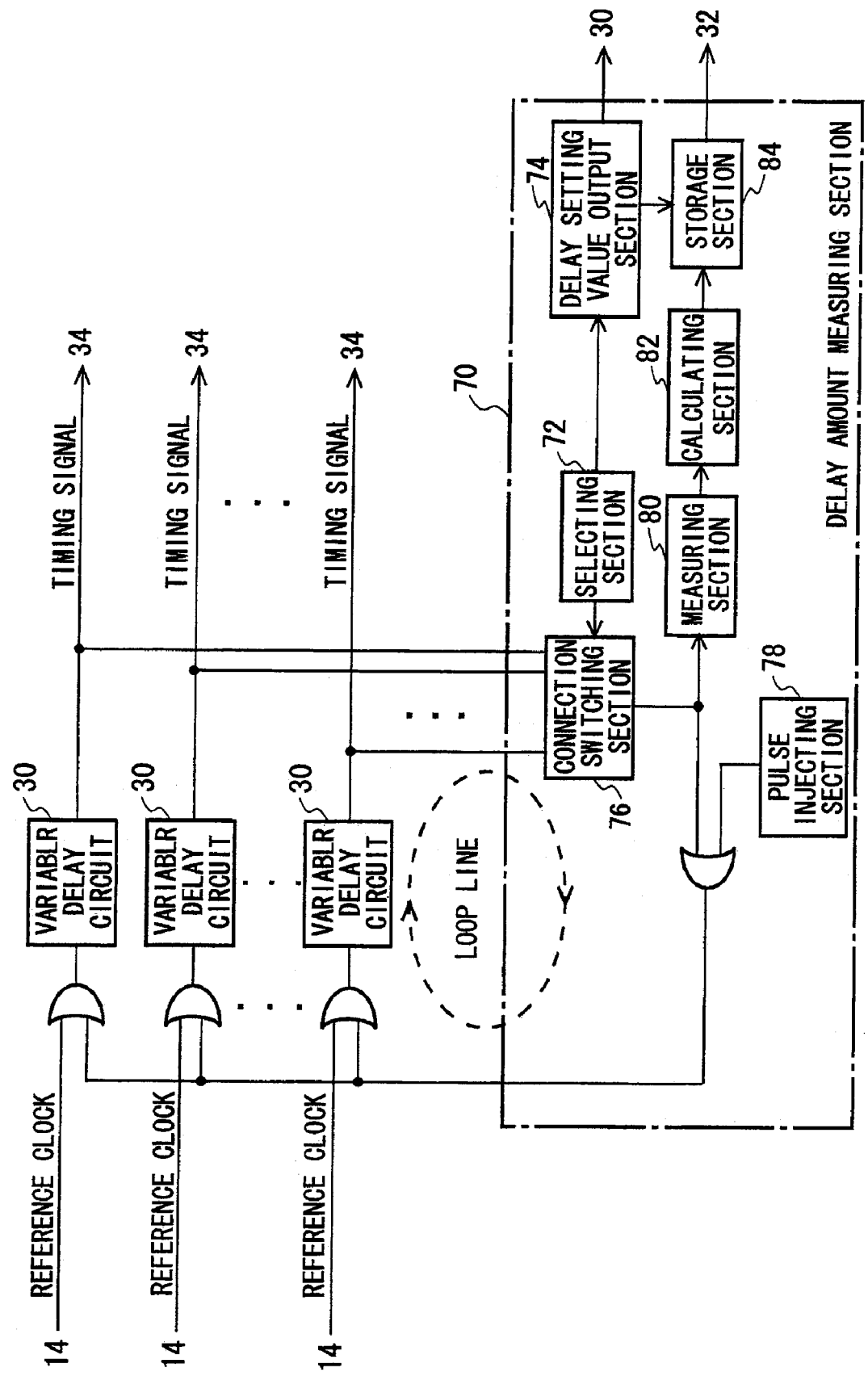
FIG. 6 shows an exemplary configuration of a delay amount measuring section 70 together with a plurality of variable delay circuits 30 according to the present embodiment.

FIG. 6 shows an exemplary configuration of a delay amount measuring section 70 together with a plurality of variable delay circuits 30 according to the present embodiment. The test signal supplying section 20 may further include the delay amount measuring section 70. The delay amount measuring section 70 includes a selecting section 72, a delay setting value output section 74, a connection switching section 76, a pulse injecting section 78, a measuring section 80, a calculating section 82, and a storage section 84.

The selecting section 72 selects, one at a time, a plurality of variable delay circuits 30 corresponding to groups associated with the test signal supplying section 20. The delay setting value output section 74 sequentially outputs the delay setting value to the variable delay circuits 30 selected by the selecting section 72 to switch the delay settings of the selected variable delay circuits 30. The connection switching section 76 switches the connections of the variable delay circuits 30 selected by the selecting section 72 such that these variable delay circuits 30 form a loop line.

The pulse injecting section 78 inputs a single pulse to the loop line formed by the connection switching section 76. In this way, the loop line loops the one pulse to generate a frequency corresponding to the total -delay amount of the loop line. The measuring section 80 measures the number of times the pulse input by the pulse injecting section 78 cycles through the loop line during a preset measurement period. The calculating section 82 calculates the total loop delay amount of the loop line based on the number of times measured by the measuring section 80. The measuring section 80 then calculates the actual physical delay corresponding to each delay setting value by subtracting, from the delay setting value, the smallest total loop delay amount, i.e. a zero delay amount corresponding to a zero setting value.

For each variable delay circuit 30, the storage section 84 stores in the corresponding memory 32 a delay setting value that causes the delay designation value to match the physical delay amount, based on the physical delay amounts obtained for the delay setting values calculated for the plurality of variable delay circuits 30. For example, the storage section 84 detects, for each variable delay circuit 30, a delay setting value that results in the smallest difference between the delay designation value and the physical delay amount of the measurement result, and stores this delay setting in the corresponding memory 32.

A connection switching section 76, a pulse injecting section 78, and a measuring section 80 may be included in each first semiconductor device 22. A selecting section 72, a delay setting value output section 74, a calculating section 82, and a storage section 84 may be included in each micro-controller 40 inside each second semiconductor device 24.

Figure 7:
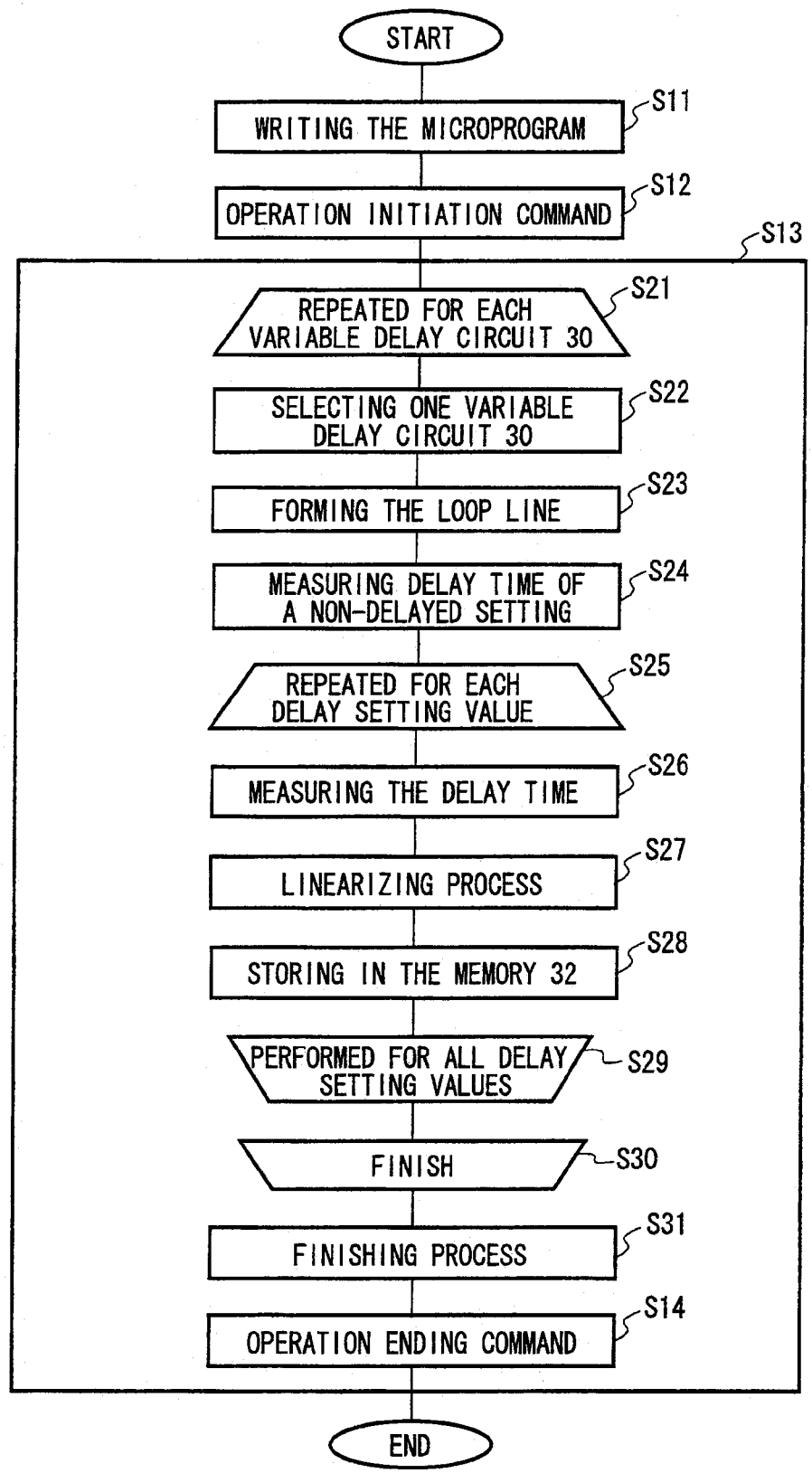
FIG. 7 shows an exemplary process flow performed by the test apparatus 10 according to the present embodiment.

FIG. 7 shows an exemplary process flow performed by the test apparatus 10 according to the present embodiment. First, the control apparatus 12 uses a broadcast or the like to write the microprogram to the program memory 42 in each test signal supplying section 20 via the tester bus 60 (S11). The control apparatus 12 then supplies the micro-controller 40 in each test signal supplying section 20 with a command to initiate the linearity correction process via the tester bus 60 (S12).

Next, each micro-controller 40 that receives the command for initiating the linearity correction process executes the microprogram written to the corresponding program memory 42 to perform the processes from step S21 to step S31 in parallel (S13).

At step S13, each micro-controller 40 repeats the processes from step S22 to step S29 for the corresponding variable delay circuits 30 (S21, S30). First, in the loop of processes from S22 to S29, the selecting section 72 writes setting values to a register or the like included in the first semiconductor device 22 to select one variable delay circuit 30 from among the plurality of variable delay circuits 30 using the connection switching section 76 inside the first semiconductor device 22 (S22). Next, the connection switching section 76 inside the first semiconductor device 22 forms a loop line including the selected variable delay circuit 30, according to the setting from the selecting section 72 (S23). The pulse injecting section 78 then inputs a pulse to the loop line and the measuring section 80 in the first semiconductor device 22 measures the delay time of the variable delay circuit 30 set to a non-delayed state (S24).

Next, the delay setting value output section 74 sequentially sets each delay setting value for the variable delay circuit 30 by writing each setting value in the register or the like inside the first semiconductor device 22 to the variable delay circuit 30, and then repeats the processes from step S26 to step S28 (S25, S29). In the process loop from step S26 to step S28, the measuring section 80 inside the first semiconductor device 22 measures the delay time of the variable delay circuit 30 set to the delay setting value set by the delay setting value output section 74, according to instructions from the micro-controller 40 (S26). Next, the calculating section 82 acquires the delay time measured by the measuring section 80 and performs a linearization process to calculate a delay setting value for each delay designation value based on the acquired delay time (S27). The linearization process performed by the calculating section 82 may involve detecting the delay setting value that causes each delay designation value to be closest to the physical delay amount of the measurement result and associating the detected values with the delay designation values. Next, the storage section 84 stores the delay setting values corresponding to the delay designation values calculated by the linearization process in the memory 32 corresponding to the selected variable delay circuit 30 (S28).

When the loop process from S21 to S30 is finished for each test signal supplying section 20, each micro-controller 40 performs a completion process that sends the control apparatus 12 completion notification (S31), for example, and the linearity correction process is then finished (S13).

When the linearity correction process is completed for each test signal supplying section 20 at step S13, the control apparatus 12 supplies the micro-controller 40 in each test signal supplying section 20 with an operation ending command, using a broadcast or the like, via the tester bus 60 (S14). Upon receiving the operation ending command, each micro-controller 40 stops execution of the microprogram.

In the manner described above, the test apparatus 10 can cause a plurality of second semiconductor devices 24 to operate in parallel to perform the linearity correction process on a plurality of variable delay circuits 30 in parallel. In this way, the test apparatus 10 can quickly perform the linearity correction process for the plurality of variable delay circuits 30. For example, a test apparatus 10 provided with 128 second semiconductor devices 24 can decrease the processing time to $\frac{1}{128}$ of the original time.

Figure 8:
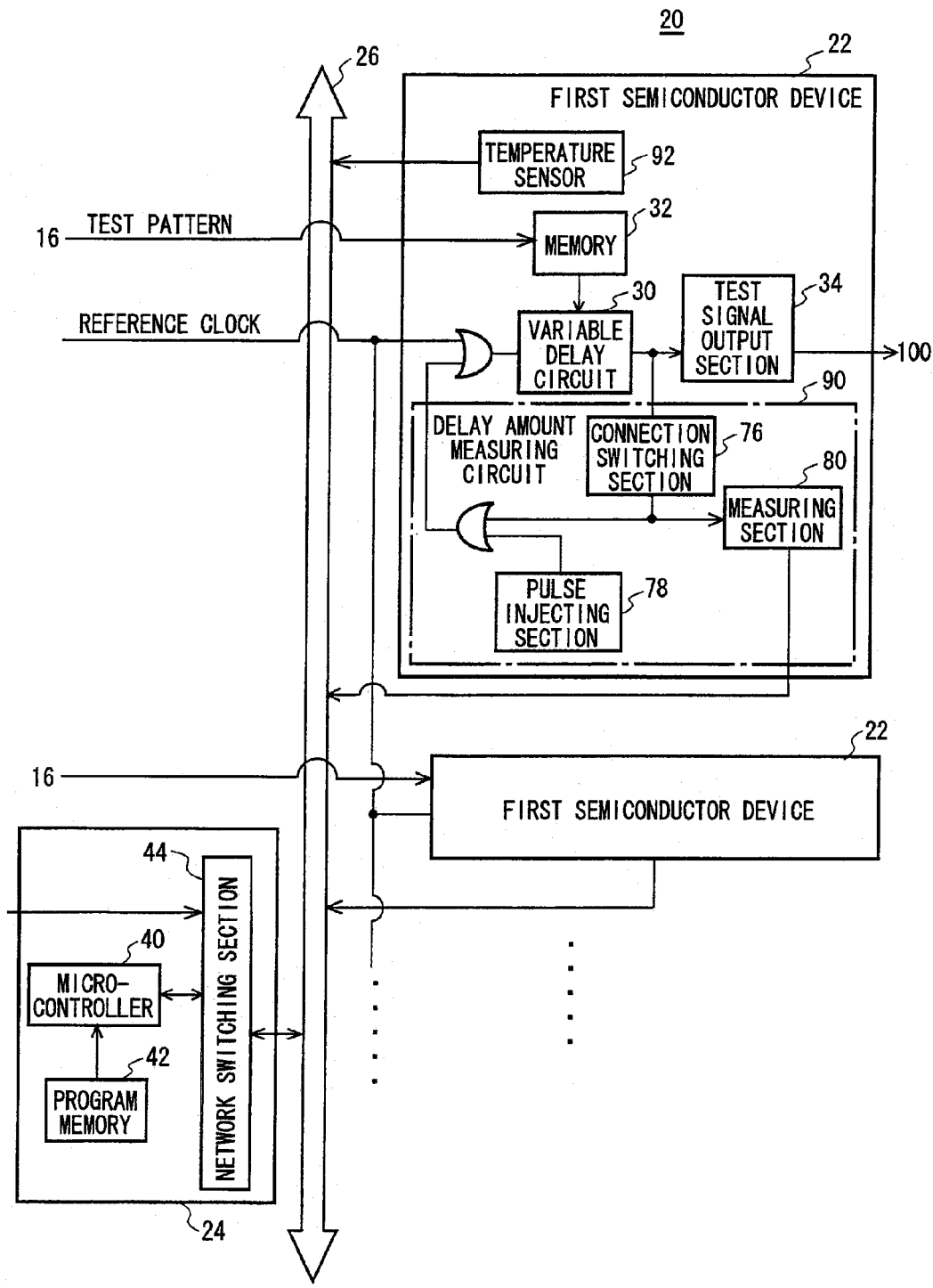
FIG. 8 shows a configuration of the test signal supplying section 20 according to a modification of the present embodiment.

FIG. 8 shows a configuration of the test signal supplying section 20 according to a modification of the present embodiment. The present modification has substantially the same function and configuration as the test signal supplying section 20 of the present embodiment, and therefore the following description includes only differing points and the components in FIG. 8 that have the same function and configuration as components in FIGS. 2 and 7 are given the same numerals.

Each test signal supplying section 20 of the present modification further includes a plurality of delay amount measuring circuits 90 corresponding respectively to the plurality of input terminals. The plurality of first semiconductor devices 22 may each include a number of delay amount measuring circuits 90 equal to the number of input terminals corresponding to the first semiconductor device 22.

Each delay amount measuring circuit 90 includes a connection switching section 76, a pulse injecting section 78, and a measuring section 80. During the linearity correction process, the connection switching section 76 switches the connection of the corresponding variable delay circuit 30 to form a loop line including the variable delay circuit 30. The pulse injecting section 78 inputs a pulse to the loop line formed by the connection switching section 76. The measuring section 80 measures the number of times the pulse cycles through the loop line during a measurement period having a preset length. In the present invention, each micro-controller 40 operates in parallel such that the measurement periods of the two or more delay amount measuring circuits 90 corresponding to the micro-controller 40 in each group overlap.

In this way, the test apparatus 10 of the present modification can cause each first semiconductor device 22 to perform the measurements of the delay amounts of the variable delay circuits 30 in parallel, and can therefore further speed up the linearity correction process of the variable delay circuits 30.

The first semiconductor device 22 in each test signal supplying section 20 of the present modification may further include a temperature sensor 92 that detects the temperature of the first semiconductor device 22. In this case, each memory 32 stores the delay setting value obtained as the result of the linearity correction process performed at the temperature value detected by the temperature sensor 92, for each temperature value, e.g. for each temperature difference of 1 degree Celsius. In this case, each micro-controller 40 selects which delay setting value to output from among the delay setting values corresponding to the temperature setting values stored in the memory 32 in the first semiconductor device 22, based on the temperature of the first semiconductor device 22 including the group associated with the micro-controller 40. In this way, the test signal supplying section 20 can keep the delay times corresponding to the delay designation values constant to maintain accurate timing, even when a temperature change in the first semiconductor device 22 causes a change in the delay time of a variable delay circuit 30 corresponding to the delay setting time. Furthermore, each micro-controller 40 may inform the system of a temperature irregularity if the corresponding temperature sensor 92 detects a temperature change beyond a desired range, e.g. a temperature change of 2 degrees Celsius or more, in the temperature during the linearity correction process. In this way, the test apparatus 10 can further increase testing quality for tests that require a stabilized timing. The temperature sensor 92 may be housed in the test signal supplying section 20 shown in FIG. 2 and inform the system of temperature irregularities in the same way.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention enable the realization of a test apparatus and a test module that can quickly perform a linearity correction process on a plurality of variable delay circuits.

What is claimed is:

1. A test apparatus that tests a device under test, comprising:
    a control apparatus that controls the test apparatus;
    a pattern generator that generates a plurality of test patterns to be provided to a plurality of input terminals of the device under test;
    a plurality of variable delay circuits that designate a timing for supplying each of the plurality of test patterns to a corresponding input terminal of the plurality of input terminals; and
    a plurality of micro-controllers that operate in parallel, according to instructions from the control apparatus, to each measure a delay amount of a variable delay circuit when the variable delay circuit is set with a prescribed delay setting value and store the delay setting value in association with the measured delay amount;
    a reference clock generator that generates a reference clock;
    a plurality of test signal supplying sections that are provided to correspond respectively to a plurality of groups, each group including two or more input terminals from among the plurality of input terminals, and that each supply test signals based on the test patterns to the input terminals in the corresponding group, wherein
    each test signal supplying section includes:
        a plurality of the variable delay circuits;
        at least one micro-controller from among the plurality of micro-controllers;
        a plurality of memories that are provided to correspond respectively to the input terminals in the corresponding group, and that each output, to a corresponding variable delay circuit, a delay setting value stored in association with a delay designation value designated by the test pattern of the corresponding input terminal; and
        a plurality of test signal output sections that are provided to correspond respectively to the input terminals in the corresponding group, and that each output, to the corresponding input terminal, a test signal based on a corresponding timing signal,
    the plurality of variable delay circuits are provided to correspond respectively to the input terminals in each of the groups, and each generate a timing signal by delaying the reference clock by a delay amount according to a delay setting value input thereto, and
    the plurality of micro-controllers measure the delay amount based on the delay setting value for each variable delay circuit corresponding to each group according to instructions from the control apparatus, and each store the delay setting value associated with the delay designation value based on the measurement result for each variable delay circuit in the corresponding memory.

2. The test apparatus according to claim 1, wherein each test signal supplying section includes:
    a plurality of first semiconductor devices that each have one of the variable delay circuits, one of the memories, and one of the test signal output sections, which are provided to correspond to at least one input terminal in the corresponding group;
    a second semiconductor device that includes the at least one micro-controller and is connected to the control apparatus; and
    a local network that connects the second semiconductor device to the plurality of first semiconductor devices, and
each second semiconductor device sends a request for accessing a register in one of the first semiconductor devices from the control apparatus to the local network, receives an access response from the first semiconductor device via the local network, and sends the access response to the control apparatus.

3. The test apparatus according to claim 2, wherein
each second semiconductor device further includes a network switching section that switches whether (i) the micro-controller in the second semiconductor device is connected to the local network so that the micro-controller controls the first semiconductor devices or (ii) the control apparatus is connected to the local network via the second semiconductor device, and
the control apparatus, when adjusting the delay setting value of a variable delay circuit associated with a group, sets the network switching section to connect the micro-controller to the local network and, when accessing a register in a first semiconductor device, sets the network switching section to connect the control apparatus to the local network.

4. The test apparatus according to claim 2, wherein
each first semiconductor device further includes a temperature sensor that detects a temperature of the first semiconductor device,
each memory stores a delay setting value for each of a plurality of temperature setting values, in association with each delay designation value, and
each micro-controller selects a delay setting value corresponding to a certain temperature setting value stored in each memory in the corresponding first semiconductor device to output, based on the temperature of each first semiconductor device corresponding to the group associated with the micro-controller.

5. The test apparatus according to claim 2, wherein
each test signal supplying section further includes a plurality of delay amount measuring circuits that are provided to correspond respectively to the plurality of input terminals,
each delay amount measuring circuit includes:
    a connection switching section that switches a connection of the corresponding variable delay circuit to form a loop line that includes the variable delay circuit;

a pulse injecting section that inputs a pulse to the loop line; and a measuring section that measures a number of times the pulse cycles through the loop line during a measurement period having a preset length, and each micro-controller causes two or more delay amount measuring circuits to operate in parallel such that the measurement periods of the two or more delay amount measuring circuits corresponding to the group associated with the micro-controller overlap.

6. The test apparatus according to claim 2, wherein each test signal supplying section further includes a program memory that stores a microprogram that is executed by the corresponding micro-controller, and the control apparatus, prior to setting the delay setting values in the plurality of memories, writes the microprogram onto the program memory in each test signal supplying section.

7. A test module that is implemented in a test apparatus testing a device under test, comprising:

a pattern generator that generates a plurality of test patterns to be provided to a plurality of input terminals of the device under test;

a plurality of variable delay circuits that designate a timing for supplying each of the plurality of test patterns to a corresponding input terminal of the plurality of input terminals;

a plurality of micro-controllers that operate in parallel, according to instructions from a control apparatus, to each measure a delay amount of a variable delay circuit when the variable delay circuit is set with a prescribed delay setting value and store the delay setting value in association with the measured delay amount; a plurality of test signal supplying sections that are provided to correspond respectively to a plurality of groups, each group including two or more input terminals from among the plurality of input terminals, and that each supply test signals based on the test patterns to the input terminals in the corresponding group, wherein each test signal supplying section includes:

a plurality of the variable delay circuits;

at least one micro-controller from among the plurality of micro-controllers;

a plurality of memories that are provided to correspond respectively to the input terminals in the corresponding group, and that each output, to a corresponding variable delay circuit, a delay setting value stored in association with a delay designation value designated by the test pattern of the corresponding input terminal; and a plurality of test signal output sections that are provided to correspond respectively to the input terminals in the corresponding group, and that each output, to the corresponding input terminal, a test signal based on a corresponding timing signal, the plurality of variable delay circuits are provided to correspond respectively to the input terminals in each of the groups, and each generate a timing signal by delaying the reference clock of the test apparatus by a delay amount according to a delay setting value input thereto, and the plurality of micro-controllers measure the delay amount based on the delay setting value for each variable delay circuit corresponding to each group according to instructions from a control apparatus that controls the test apparatus, and each store the delay setting value associated with the delay designation value based on the measurement result for each variable delay circuit in the corresponding memory.

8. The test module according to claim 7, wherein each test signal supplying section includes:

a plurality of first semiconductor devices that each have one of the variable delay circuits, one of the memories, and one of the test signal output sections, which are provided to correspond to at least one input terminal in the corresponding group;

a second semiconductor device that includes the at least one micro-controller and is connected to the control apparatus; and a local network that connects the second semiconductor device to the plurality of first semiconductor devices, and each second semiconductor device sends a request for accessing a register in one of the first semiconductor devices from the control apparatus to the local network, receives an access response from the first semiconductor device via the local network, and sends the access response to the control apparatus.

9. The test module according to claim 8, wherein each second semiconductor device further includes a network switching section that switches whether (i) the micro-controller in the second semiconductor device is connected to the local network so that the micro-controller controls the first semiconductor devices or (ii) the control apparatus is connected to the local network via the second semiconductor device, and the control apparatus, when adjusting the delay setting value of a variable delay circuit associated with a group, sets the network switching section to connect the micro-controller to the local network and, when accessing a register in a first semiconductor device, sets the network switching section to connect the control apparatus to the local network.

10. The test module according to claim 8, wherein each first semiconductor device further includes a temperature sensor that detects a temperature of the first semiconductor device, each memory stores a delay setting value for each of a plurality of temperature setting values, in association with each delay designation value, and each micro-controller selects a delay setting value corresponding to a certain temperature setting value stored in each memory in the corresponding first semiconductor device to output, based on the temperature of each first semiconductor device corresponding to the group associated with the micro-controller.

11. The test module according to claim 8, wherein each test signal supplying section further includes a plurality of delay amount measuring circuits that are provided to correspond respectively to the plurality of input terminals, each delay amount measuring circuit includes:

a connection switching section that switches a connection of the corresponding variable delay circuit to form a loop line that includes the variable delay circuit;

a pulse injecting section that inputs a pulse to the loop line; and a measuring section that measures a number of times the pulse cycles through the loop line during a measurement period having a preset length, and each micro-controller causes two or more delay amount measuring circuits to operate in parallel such that the measurement periods of the two or more delay amount measuring circuits corresponding to the group associated with the micro-controller overlap.

12. The test module according to claim 8, wherein each test signal supplying section further includes a program memory that stores a microprogram that is executed by the corresponding micro-controller, and the control apparatus, prior to setting the delay setting values in the plurality of memories, writes the microprogram onto the program memory in each test signal supplying section.

* * * * *